United States Patent
Akaishi et al.

(10) Patent No.: US 6,614,075 B2
(45) Date of Patent: Sep. 2, 2003

(54) SEMICONDUCTOR DEVICE AND METHOD OF MANUFACTURING THE SAME

(75) Inventors: Yumiko Akaishi, Gunma (JP); Takuya Suzuki, Saitama (JP); Shinya Mori, Saitama (JP); Yuji Tsukada, Gunma (JP); Yuichi Watanabe, Gunma (JP); Shuichi Kikuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/852,540

(22) Filed: May 10, 2001

(65) Prior Publication Data

US 2001/0025987 A1 Oct. 4, 2001

Related U.S. Application Data

(62) Division of application No. 09/512,520, filed on Feb. 24, 2000, now Pat. No. 6,255,154.

(30) Foreign Application Priority Data

Mar. 12, 1999 (JP) .......................... P.11-066870

(51) Int. Cl.[7] .................. H01L 29/78; H01L 29/76; H01L 29/94
(52) U.S. Cl. .................. 257/336; 257/335; 257/342; 257/343; 257/344; 257/409
(58) Field of Search .................. 257/327–8, 335–6, 257/342, 343, 344, 346, 409

(56) References Cited

U.S. PATENT DOCUMENTS

| 3,953,255 | A | * | 4/1976 | Combs, Jr. .................. 148/187 |
| 4,823,173 | A | * | 4/1989 | Beasom ..................... 357/22 |
| 5,177,571 | A | * | 1/1993 | Satoh et al. ................ 257/336 |
| 5,517,046 | A | * | 5/1996 | Hsing et al. ................ 257/336 |
| 5,872,382 | A | * | 2/1999 | Schwalke et al. ........... 257/408 |

* cited by examiner

Primary Examiner—Minh Loan Tran
Assistant Examiner—Johannes P Mondt
(74) Attorney, Agent, or Firm—Fish & Richardson P.C.

(57) ABSTRACT

A semiconductor device includes
a source region 4, a channel region 8, a drain region 5
and a gate electrode which is patterned so that its side wall is tapered to be more narrow toward the top. A drift region 22 is formed between the channel region 8 and drain region 5 so as to be shallow below the gate electrode 7A (first $N^-$ layer 22A) and deep in the vicinity of the drain region 5 (second $N^-$ layer 22B).

This configuration contributes to boosting the withstand voltage and reducing the "on" resistance of the semiconductor device.

7 Claims, 7 Drawing Sheets

SEMICONDUCTOR DEVICE AND METHOD OF MANUFACTURING THE SAME

This is a divisional of application Ser. No. 09/512,520, filed Feb. 24, 2000 now U.S. Pat. No. 6,255,154.

BACKGROUND OF THE INVENTION

1. Field of the Invention

The present invention relates to a semiconductor device and a method of manufacturing it, and more particularly to LD (Lateral Double Diffused) MOS transistor technology which is used for a high voltage element for e.g. liquid crystal driving IC.

2. Description of the Related Art

Now, an LDMOS transistor structure refers to a structure in which impurities with a different conduction type are diffused in a diffused region formed on surface of a semiconductor substrate to form another diffused region and a difference in the horizontal diffusion between these diffused regions is employed as an effective channel length. This structure, in which a short channel is formed, can constitute an element with low "on" resistance.

FIGS. 11A and 11B are a sectional view for explaining a conventional LDMOS transistor. A N-channel LDMOS transistor structure is illustrated. Although the structure of a P-channel LDMOS transistor structure is not explained here, it is well known that the same structure can be adopted except for its conduction type.

In FIG. 11A, reference numeral 1 denotes a semiconductor substrate with a first conduction type, e.g. P-type, and reference numeral 2 denotes a P-type well region. A P-type body region 3 is formed within the P-type well region 1. An N-type diffused region 4 is formed within the P-type body region 3. Another N-type diffused region 5 is formed apart from the N-type diffused region 4. A gate electrode 7 is formed on the surface of the substrate 1 through a gate insulating film 6. A channel region 8 is formed in the surface region of the P-type body region 3 immediately below the gate electrode.

The N-type diffused region 4 is used as a source region whereas the N-type diffused region is used as a drain region. The N-type well region 2 below a LOCOS oxide film 9 is used as a drift region. Further, reference numerals 10 and 11 denote a source electrode and drain electrode, respectively. Reference numeral 12 denotes a P-type diffused region for assuming the potential of the P-type body region 3 and reference numeral 13 denotes an interlayer insulating film.

In the above LDMOS transistor, since the N-type well region 2 is formed by diffusion, a high impurity concentration is given on the surface of the N-type well region, a current is apt to flow in the surface of the N-type well region, thereby realizing a high withstand voltage. The LDMOS transistor having such a configuration is referred to as a surface relax type (RESURF)LDMOS. The dopant concentration of the drift region in the N-type well region 2 is set so as to satisfy the condition of RESURF. Such a technique is disclosed in JP-A-9-139438.

However, since the impurity concentration is high in the surface of the N-type well region, P-type impurity for forming the P-type body region 3 cannot diffuse sufficiently. Therefore, as shown in FIG. 11B, the edge of the P-type body region 3 approaches the source region (N-type diffused region 4) so that the channel region 8 may be not be formed to have a suitable size (see indicated arrow A).

SUMMARY OF THE INVENTION

An object of the invention is to provide a method of manufacturing a semiconductor device which can satisfy the requirements of a high withstand voltage and reduced "on" resistance.

In order to solve the above problem, for example as shown in FIG. 1, a first conduction type body region (e.g. P-type body region 3) is formed by ion-implanting first conduction type impurities (e.g. boron ions) using as a mask a gate electrode patterned so that its side wall is tapered to be more narrow toward the top. Further, a second conduction type source region (e.g. N-type diffused region) is formed by ion-implanting second conduction type impurities (e.g. phosphorus ions) using as a mask the gate electrode 7A. In this way, by using the tapered shape of the gate electrode 7A as a mask during the ion-implantation and controlling a depth of the implantation, relative positions can be optimized among the P-type body region 3, source region and channel region 8.

In accordance with the invention, in an LDMOS transistor in which two kinds of impurities with different conduction types are diffused using a gate electrode as a mask and a difference in the horizontal diffusion between diffused regions is employed as an effective channel length, the gate electrode is patterned so that its side wall is tapered to be more narrow toward the top. In this configuration, it is possible to the problem that the impurities with an opposite conduction type adjacent to the drift region cannot diffuse sufficiently owing to the surface concentration of the drift region so that the channel region cannot be formed properly.

In accordance with the invention, the drift region is formed using a difference in the diffusion length is used between at least two kinds of second conduction type impurities with different diffusion coefficients and at least one kind of first conduction type impurities having a diffusion coefficient approximately equal to or larger than at least one kind of the second conduction impurities. This simplifies a process of manufacturing the semiconductor device.

Further, in accordance with the invention, since the gate electrode is structured so that its side wall is tapered to be more narrow toward the top, it is possible to overcome the danger that when the conductive film formed on the entire substrate surface inclusive of the gate electrode for the gate electrode of the other transistor to be formed on the same substrate is patterned for removal, the conductive film is left on the side wall of the gate electrode, thereby giving rise to poor short-circuiting.

The above and other objects and features of the invention will be more apparent from the following description taken in conjunction with the accompanying drawings.

BRIEF DESCRIPTION OF THE DRAWINGS

FIGS. 1 to 8 are sectional views for explaining a method of manufacturing a semiconductor device according to an embodiment of the invention; and FIG. 9 is a graph showing concentration of various ions for explaining the theory of forming a drift region according to the invention; and FIGS. 10A and 10B are theoretical views of a method of manufacturing the semiconductor device according to the invention; and FIG. 11 is a sectional view of a conventional semiconductor device.

DESCRIPTION OF THE PREFERRED EMBODIMENTS

Now referring to the drawings, an explanation will be given of an embodiment of a semiconductor device according to the invention and a method of manufacturing it.

FIG. 1 is a sectional view for explaining a LDMOS transistor according to the invention. A N-channel LDMOS transistor structure is illustrated. Although the structure of a P-channel LDMOS transistor structure is not explained here, it is well known that the same structure can be adopted except for its conduction type.

Figure 1:
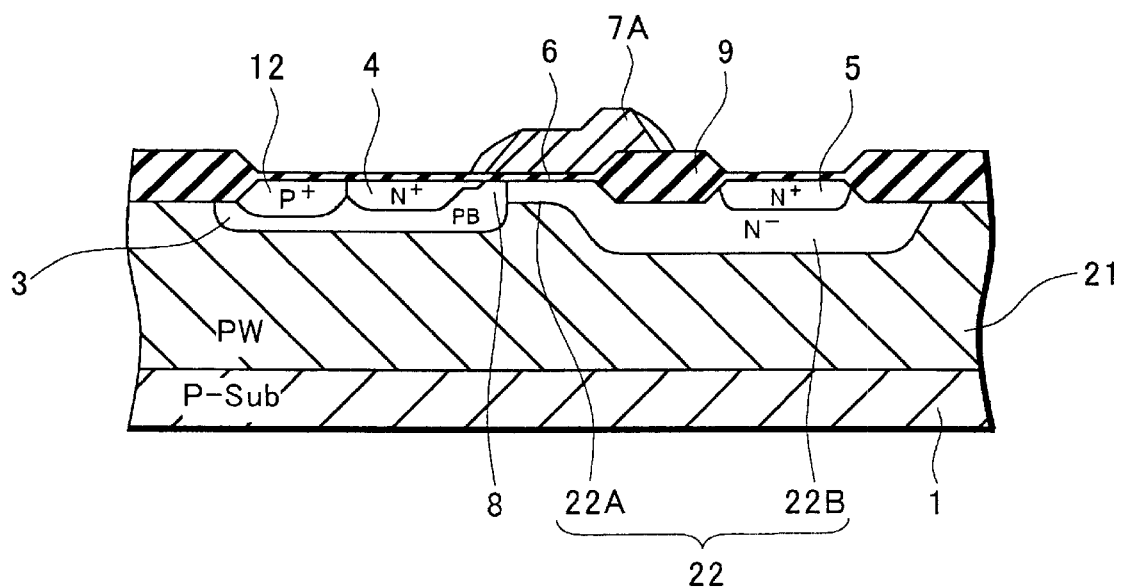

In FIG. 1, reference numeral 1 denotes a semiconductor substrate with a first conduction type, e.g. P-type, and reference numeral 21 denotes a P-type well region. Within the P-type well region 21, an N⁻ layer 22 and a P-type body region 3 are formed. An N-type diffused region 4 is formed within the P-type body region 3. Another N-type diffused region 5 is formed apart from the N-type diffused region 4. A gate electrode 7A is formed on the surface of the substrate 1 through a gate insulating film 6. A channel region 8 is formed in the surface region of the P-type body region 3 immediately below the gate electrode.

The N-type diffused region 4 is used as a source region whereas the N-type diffused region is used as a drain region. The N-type well region 2 below a LOCOS oxide film 9 is used as a drift region. Although not illustrated, like the conventional structure, a source electrode 10 and a drain electrode 11 are formed in contact with the N-type diffused regions 4 and 5. A P-type diffused region 12 for assuming the potential of the P-type body region 3 is formed so as to be adjacent to the N-type diffused region 4, and is covered with an interlayer insulating film 13.

Figure 11A:
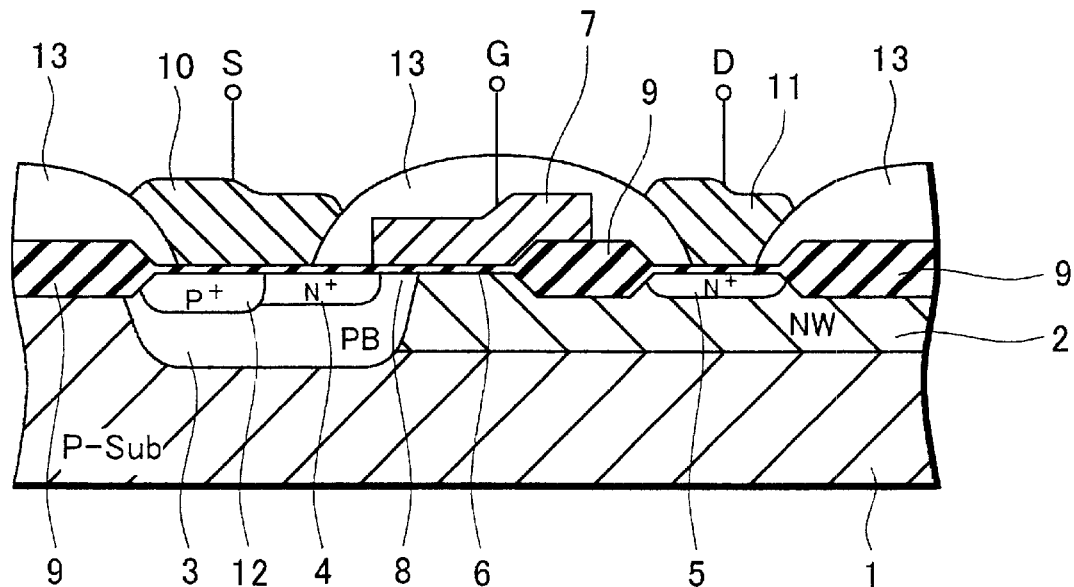
Figure 11B:
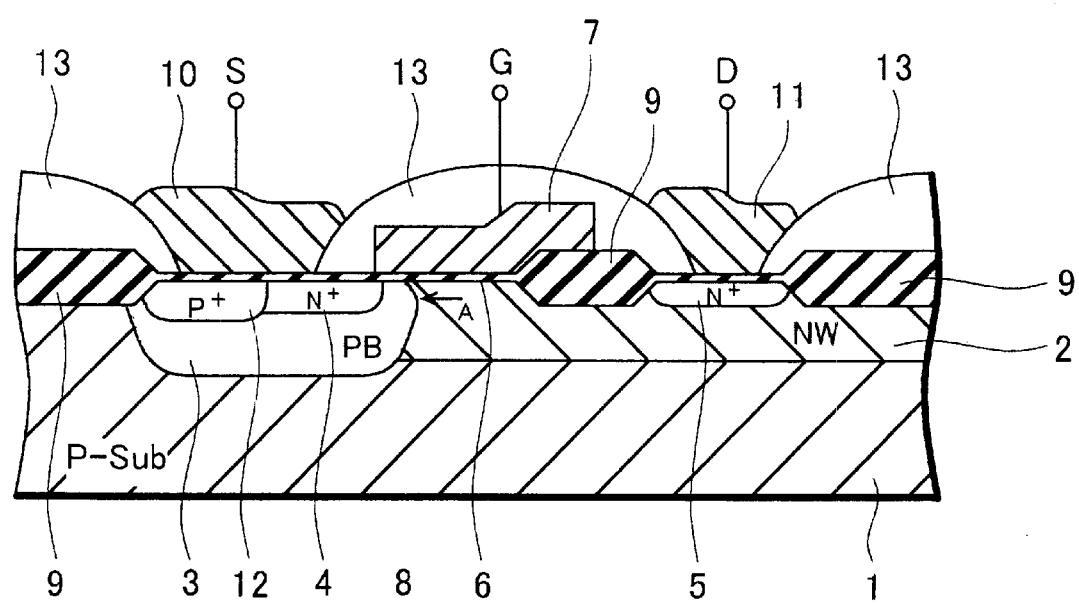

The feature of the invention resides in the shape of the gate electrode 7A. Namely, as seen from FIG. 1, the gate electrode is patterned so that its side wall is tapered to be more narrow toward the top. Because of the presence of the gate electrode 7A having such a shape, a semiconductor device can be provided in which optimum relative positions are set among the P-type body region 3, source region 4 and channel region 8, as described in detail. Specifically, when the first conduction type impurities (e.g. boron ions) are ion-implanted using the gate electrode 7A having a tapered shape thereby to form the P-type body region 3, the boron ions penetrate the tapered gate electrode so that they are also ion-implanted below the gate electrode 7A. Thus, as shown in FIG. 1, the P-type body region 3, which could not diffuse sufficiently owing to the N-well region 2 which constitutes a drift region in the conventional structure (FIG. 11B) (corresponding to N− layer 22 in the present structure), can diffuse sufficiently. In addition, since the second conduction type impurities (e.g. phosphorus ions) are ion-implanted using the gate electrode 7A as a mask thereby to form an N-type diffused region 4 (constituting a source region), it is possible to solve the problem involved with the conventional semiconductor device that the P-type body region cannot diffuse sufficiently owing to hindrance of the N-well region 2 so that the channel region cannot be formed.

In the semiconductor device according to the invention, the N⁻ layer 22 is formed within the P-type well region 21. The N⁻ layer 22 is formed so as to be shallow below the gate electrode 7A (first N⁻ layer 22A) and deep in the vicinity of the drain region 5 (second N⁻ layer 22B).

Figure 9:
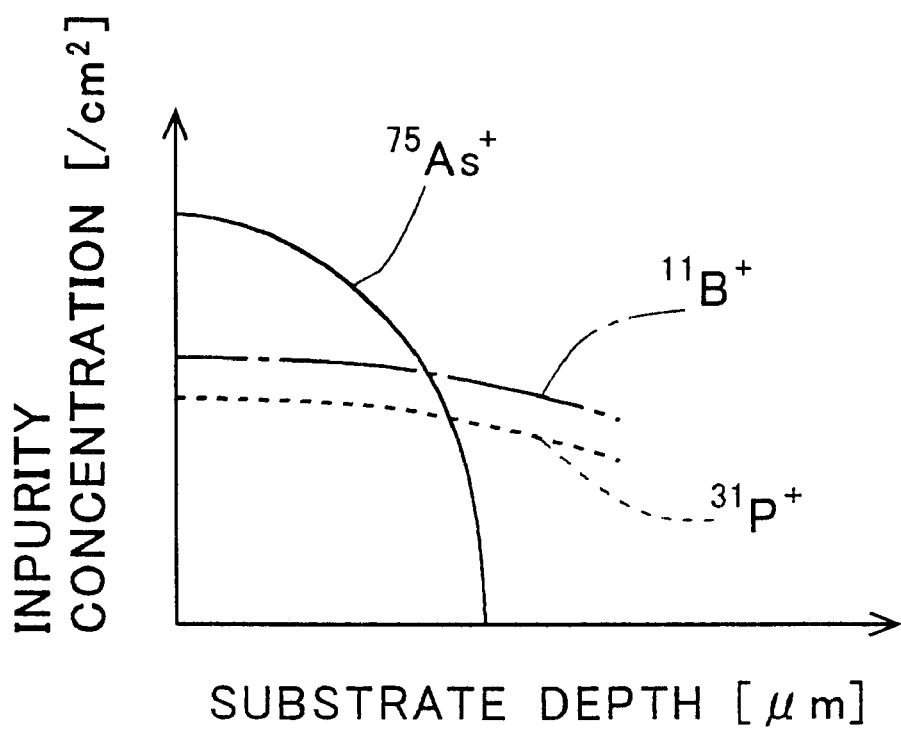

The configuration provides a further RESURF effect as compared with the conventional device. The first N⁻ layer 22A formed at a deep position below the gate electrode 7A, which has a high impurity concentration, provides reduced "on" resistance so that a current is apt to flow therefrom. In addition, the second N⁻ layer 22B which is formed in the vicinity of the drain region (drift region), which has a low impurity concentration, is likely to enlarge a depletion layer, thereby realizing the high withstand voltage of the transistor (see the graph of FIG. 9 showing the distribution of impurity concentration). Incidentally, the N-channel LDMOS transistor according to this embodiment has a withstand voltage of about 30 V. The invention can be applied to a semiconductor device which has a high RESURF effect and the P-type body region 3 is likely to diffuse insufficiently because of the presence of the drift region (first N⁻ layer).

Now referring to the drawings, an explanation will be given of a method of manufacturing a semiconductor device according to the invention.

Figure 2:
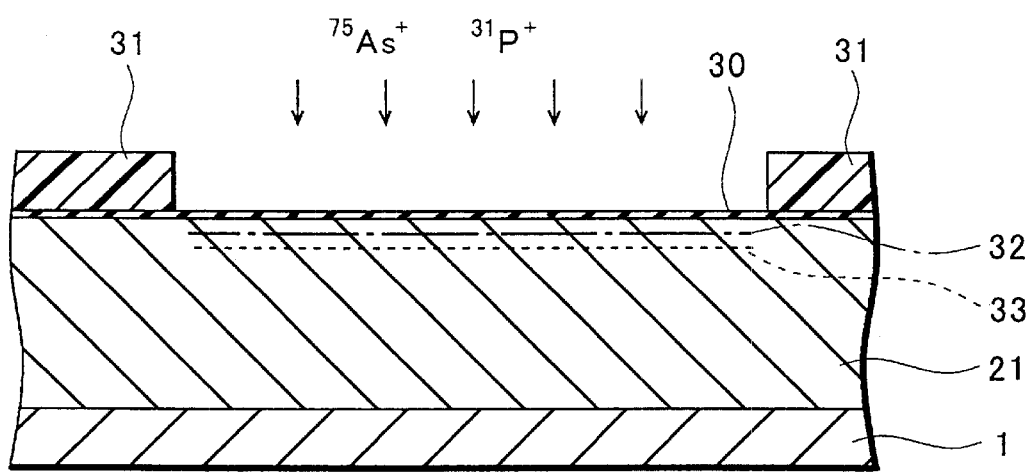

First, in FIG. 2, after a pad oxide film 30 has been formed on a P-type semiconductor substrate 1, using a photoresist film 31 as a mask, two kinds of N-type impurities (e.g. arsenic ions and phosphorus ions) are ion-implanted into a P type well region 21 to form a first ion-implanted layer 32 (one-dot chain line) and a second ion-implanted layer 33 (dotted line). These N-type impurities serve to form an N⁻ layer 22 constituting a drift region in later steps. In this step, the arsenic ions are implanted under the condition of an accelerating voltage of about 160 KeV and a dose of $3 \times 10^{12}/cm^2$, whereas the phosphorus ions are implanted under the conduction of the accelerating voltage of about 50 KeV and dose of $4 \times 10^{12}/cm^2$.

Figure 3:
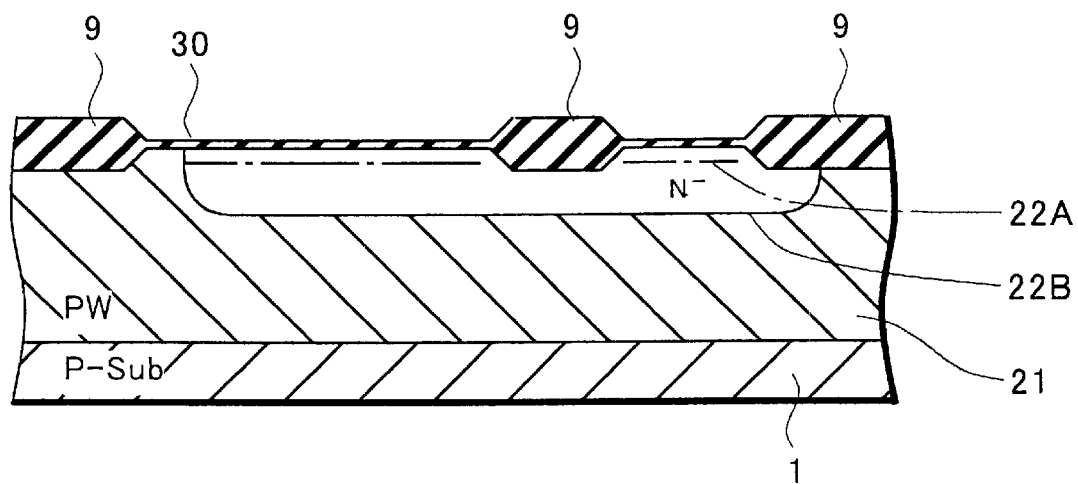

In FIG. 3, using a silicon nitride film (not shown) formed on the substrate as a mask, a certain region of the substrate surface is selectively oxidized to form LOCOS oxide films 9 each having a thickness of about 7300 Å. Simultaneously, because of a difference in the diffusion coefficient between the diffused arsenic ions and phosphorus ions, the arsenic ions are diffused into the substrate 1 so that the first N⁻ layer 22 (illustrated one-dot chain line) is formed in a relatively substrate-surface layer. The phosphorus ions are diffused into the substrate 1 so that the second N− layer 22B (illustrated by solid line) is formed at a relatively deep position in the P type well region 21.

Figure 4:
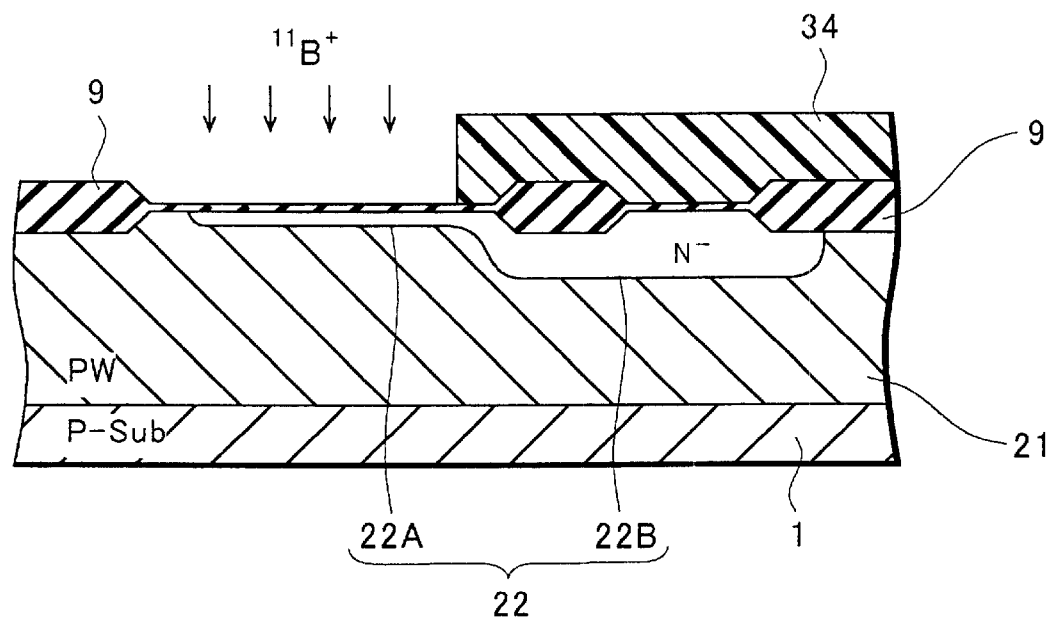

In FIG. 4, after a photoresist film 34 has been formed on the substrate 1 of a region where a drain is to be formed (referred to as "drain-forming region"), using the photoresist film 34 as a mask, P-type impurities (e.g. boron ions) are ion-implanted in the substrate-surface layer of a region where a source is to be formed (referred to as "source-forming region) and diffused. Thus, the phosphorus ions forming the second N⁻ layer 22B in the source forming region are canceled by the boron ions so that the second N⁻ layer in the source forming region is caused to disappear. In this step, for example, after the boron ions are implanted under the condition of an accelerating voltage of 80 KeV and dose of $8 \times 10^{12}/cm^2$, they are thermally diffused for two hours. Now, FIG. 9 is a graph showing the distribution of the impurity concentration when arsenic ions (illustrated by solid line), phosphorus ions (illustrated by dotted line) and boron ions (illustrated by one-dot chain line) are diffused, respectively. As seen from the graph, the concentration distribution originating from the phosphorus ions are canceled by its merging with that from the boron ions.

In this way, in accordance with the present invention, using the difference in a diffusion coefficient between the arsenic ions and phosphorus ions when the drift region is formed, the second N⁻ layer 22B of the source-forming region formed at a deep position of the substrate is caused to disappear by diffusing the boron ions implanted in the subsequent step. Thus, only the first N⁻ layer 22A formed in the substrate surface layer is left in the source-forming region. Accordingly, the semiconductor device with reduced "on" resistance reduced can be manufactured through a relatively simple manufacturing process.

Figure 5:
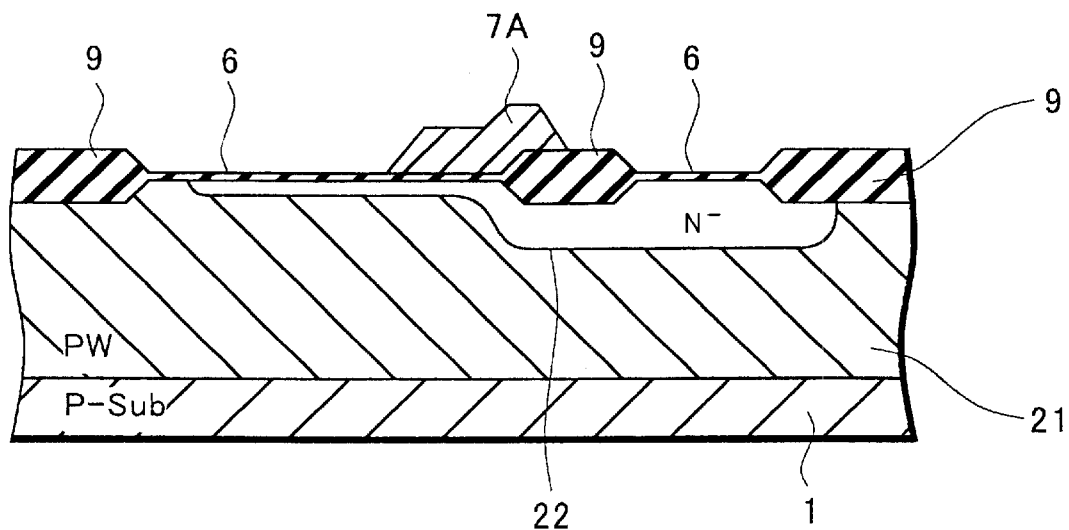

In FIG. 5, after a gate insulating film 6 having a thickness of 800 Å is formed on the substrate, a gate electrode having a thickness of 2500 A is formed so that it extends from the gate insulating film 6 to the LOCOS oxide film 9 and its side wall is tapered to be more narrow toward the top. Referring to the theoretical view of FIG. 10, an explanation will be given of a method of forming the gate electrode 7A having a tapered shape according to the invention.

Figure 10A:
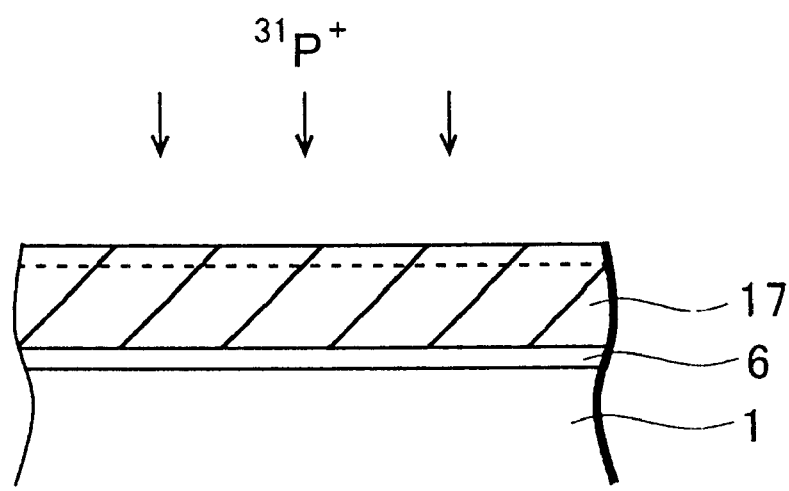

First, as shown in FIG. 10A, after a polysilicon film (which may be replaced by an amorphous silicon film) on the gate insulating film 6 on the substrate 1, the polysilicon film is doped with phosphorus from a thermal diffusion source of e.g. $POCl_3$ and made conductive. Further, impurities (e.g. phosphorus ions) are ion-implanted in only the surface layer of the polysilicon film made conductive (see xxx mark in FIG. 10A). In this step, the phosphorus ions can be ion-implanted under the condition of a low accelerating voltage of about 30–40 KeV and a relatively high concentration of $1-2\times10^{15}$/cm2.

Figure 10B:
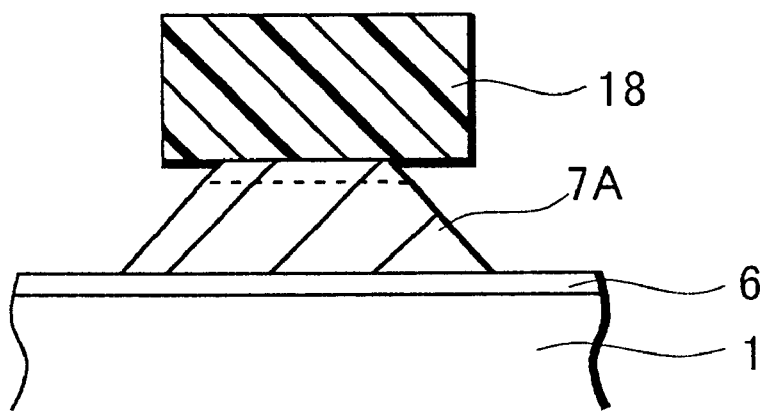

Next, as shown in FIG. 10B, using a photoresist mask formed on the polysilicon film 17 as a mask, the polysilicon film 17 is isotropically etched by an CDE (chemical dry etching) apparatus. Thus, a gate electrode 7A is formed which is patterned so that its side wall is tapered to be more narrow toward the top.

In this step, by ion-implanting the impurities previously on the surface of a conductive film for forming the gate electrode 7A, the isotropy when the conductive film is etched could be enhanced to provide a taper having a relatively uniform gradient. Additionally, the etching condition such as the thickness of the conductive film and etching gas may be optimized so that a recessed area of the surface, which may be provided by the normal isotropic etching, is not given even when the ion-implantation step of the above impurities is not executed. The tapered shape should not be limited to a comparatively uniform gradient, but may be defined in various shapes in connection with the implanting condition of boron ions for forming the P-type body region 3 in a later step.

Figure 6:
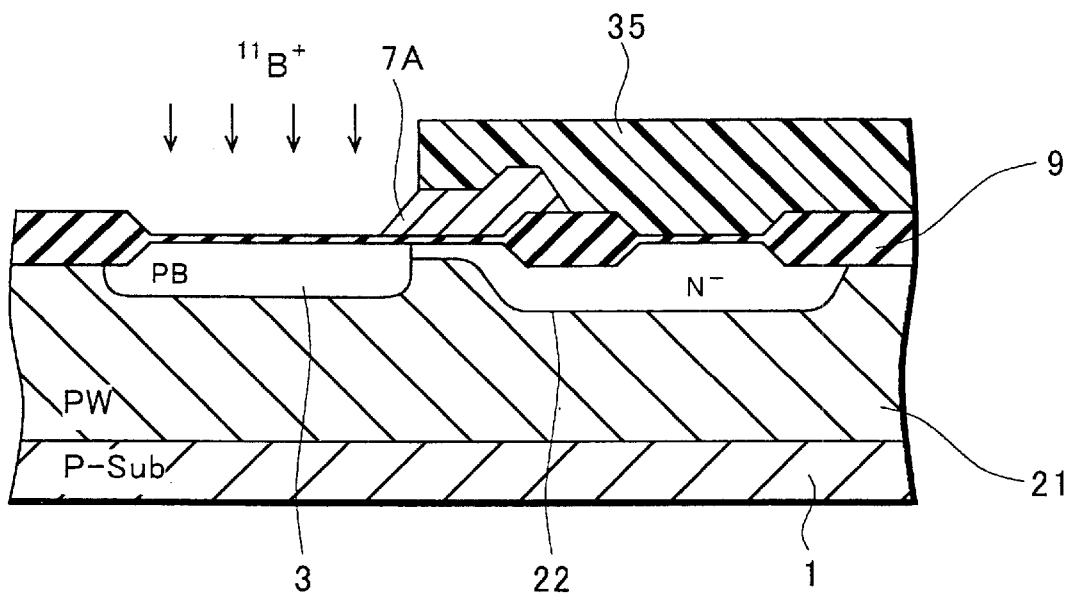

Next, in FIG. 6, using, as a mask, a photoresist film 35 formed so as to cover the gate electrode 7 and drain forming region, P-type impurities (e.g. boron ions) are implanted and diffused, thereby forming the P-type body region 3 to be adjacent to the one edge of the gate electrode 7A. (The one edge of the gate electrode 7A is exposed of the photoresist.) Incidentally, in this step, after the boron ions have been implanted under the condition of an accelerating voltage of about 40 KeV and dose of $5\times10^{13}$/cm$^2$, they are thermally diffused for two hours at 1050° C. At this time, using the tapered shape of the gate electrode 7A, the boron ions are implanted in the substrate surface layer so as to penetrate through the gate electrode 7A. Thus, it is possible to solve the conventional problem that the P-type body region 3 diffuses insufficiently owing to the presence of the N⁻ layer so that the channel region 8 having a suitable size cannot be formed when a source region (N-type diffused region 4) is formed in a later step.

In this way, the minimum change in the manufacturing process of changing the pattered shape of the gate electrode 7A permits the above problem to be solved.

The following techniques can be proposed in order to solve the above problem. First, a technique can be proposed which increases the dose of boron ions in the P-type body region 3. However, this technique excessively increases the concentration of the P-type body region 3, thereby also increasing the threshold voltage. This hinders realization of the low on-resistance which is a feature of the LDMOS transistor. Secondly, another technique can be proposed which changes the thermal processing during the diffusion of the P-type body region 3. However, this technique varies the impurity concentration distribution of another transistor (the DMOS transistor is not necessarily required), and hence requires a considerable process change of setting the impurity concentration distribution again.

As described above, the above proposed techniques have disadvantages. On the other hand, the invention can solve the problem without doing the considerable process change. In addition, the P-type body region 3 having various shapes can be formed by only adjusting the accelerating energy at the time of implantation of boron ions in accordance with the shape of the gate electrode 7A.

Figure 7:
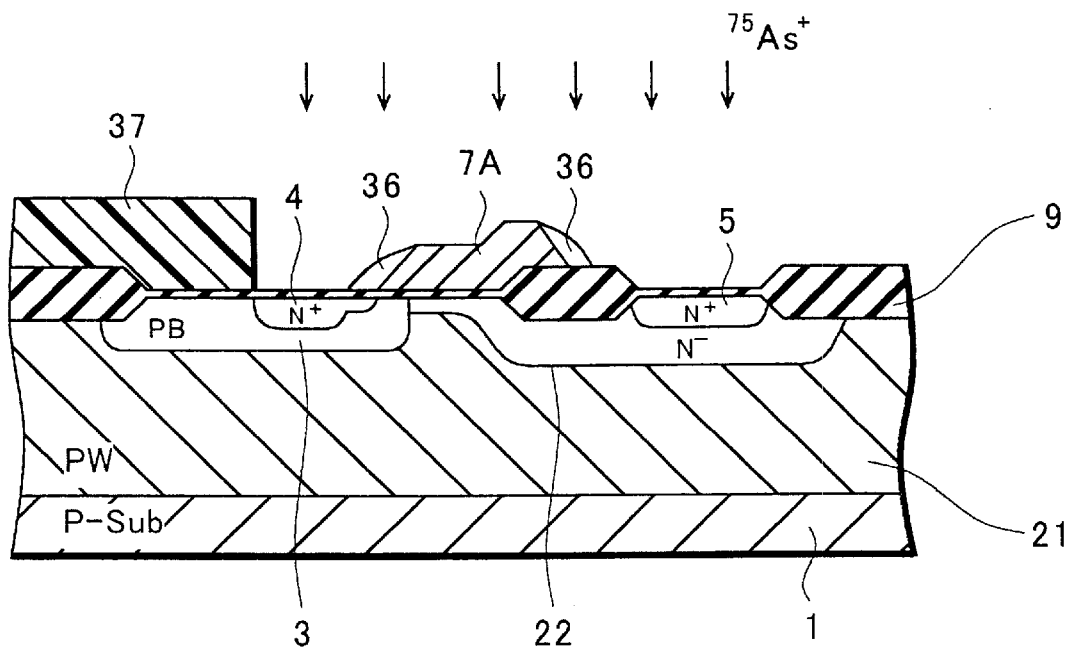

Returning to the process of manufacturing the semiconductor device, in FIG. 7, using, as a mask, a photoresist mask 37 having openings on the source region to be formed in the P-type body region 3 and the drain region, N-type impurities are diffused to form N-type diffused regions 4 and 5 which constitute the source and drain regions, respectively. In this step, where the source/drain regions are formed having an LDD structure, first, with the photoresist film 35 removed in FIG. 6, for example, phosphorus ions are implanted under the condition of an accelerating voltage of 40 KeV and dose of $3.5\times10^{13}$/cm$^2$, as shown in FIG. 7, a side wall spacer film 36 is formed on the side wall of the gate electrode 7. Using the photoresist film 37 as a mask, for example, arsenic ions are implanted under the condition of an accelerating voltage of 80 KeV and dose of $5\times10^{15}$/cm$^2$. Incidentally, in this embodiment, it is needless to say that the source/drain region should not be limited to the LDD structure. Further, in the structure of the gate electrode 7A having a tapered shape according to the invention, a certain degree of the gradient may not provide the side wall spacer 36. However, this step of implanting the arsenic ions is necessary to form the source/drain regions in an LDD structure for another transistor (the other transistor than the DMOS transistor may be adopted) formed in the same substrate.

Figure 8:
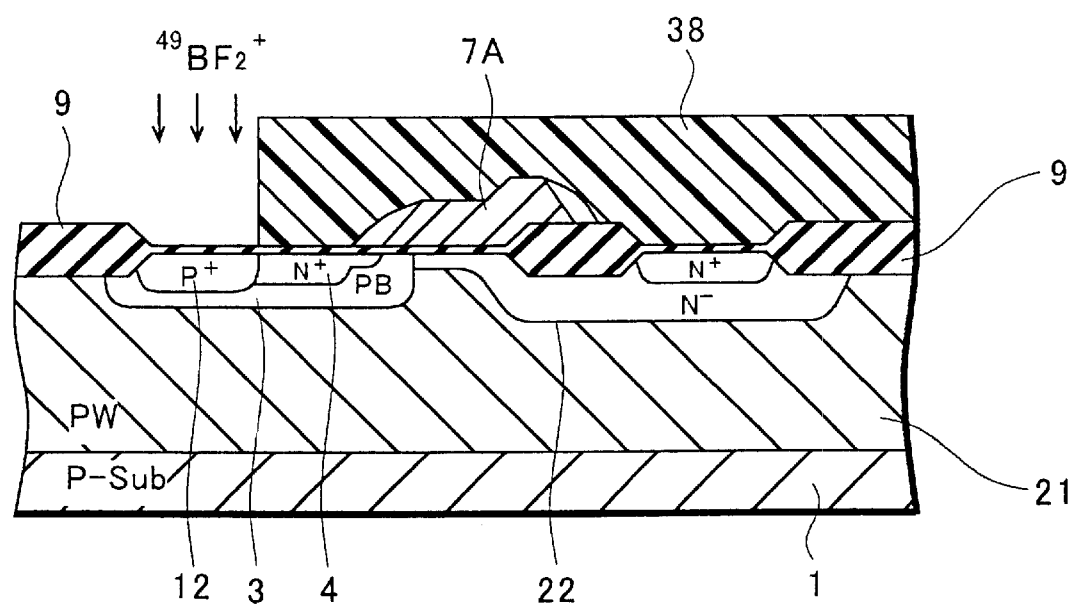

In FIG. 8, in order to form a P-type diffused region 12 adjacent to the N-type diffused region for the purpose of assuming the potential of the P-type body region 3, using a photoresist film as a mask, P-type impurities (e.g. boron difluoride ions) are implanted to form the P-type diffused region 12. In this step, the boron difluoride ions are implanted under the conduction of an accelerating voltage of 60 KeV and dose of $4\times10^{15}$/cm$^2$.

Subsequently, like the conventional structure, after the source electrode 10 and drain electrode 11 have been formed, an interlayer insulating film 13 is formed to complete the semiconductor device.

As described hitherto, in accordance with the invention, the gate electrode 7A is patterned so that its side wall is tapered to be more narrow toward the top. Because of the presence of the gate electrode 7A having such a shape, a semiconductor device can be provided in which optimum relative positions are set among the P-type body region 3, source region 3 and channel 8. Specifically, when boron ions are ion-implanted using the gate electrode 7A having a tapered shape thereby to form the P-type body region 3, the boron ions penetrate the tapered gate electrode so that they are also ion-implanted below the gate electrode 7A. Thus, the P-type body region 3, which could not diffuse sufficiently owing to the drift region in the conventional structure can diffuse sufficiently. Accordingly, the P-type body region 3 is diffused and formed suitably so that the channel region can be formed properly.

Since the gate electrode 7A according to the invention is structured so that its side wall is tapered to be more narrow toward the top, it is possible to overcome the danger that when the conductive film formed on the entire substrate surface inclusive of the gate electrode 7A for the gate electrode of the other transistor to be formed on the same substrate is patterned for removal, the conductive film is left on the side wall of the gate electrode 7A, thereby giving rise to poor short-circuiting.

Although in the above embodiments photoresist is used as a mask, it is not required to be limited to photoresist, organic mask or non-organic mask pattered by lazer irradiating can be used effectively.

What is claimed is:

1. A semiconductor device comprising:
   a gate electrode patterned on a gate insulating film on a first conduction type semiconductor substrate;
   a first conduction type body region formed adjacent to the gate electrode;
   a second conduction type source region and a channel region which are formed within said first conduction type body region;
   a drain region formed apart from said first conduction type body region; and
   a second conduction type drift region formed between the channel region and drain region so as to be shallow below the gate electrode and deep in the vicinity of the drain region,
   wherein a side wall of the gate electrode on a side of the source region is tapered.

2. A semiconductor device according to claim 1, wherein the semiconductor device further comprises a first conduction type well region formed within the first conduction type semiconductor substrate.

3. A semiconductor device according to claim 1, wherein said first conduction type body region is a first conduction type impurity diffusion region formed by implanting first conduction type impurities by using said gate electrode as a mask.

4. A semiconductor device according to claim 1, wherein said first conduction type body region is a first conduction type impurity diffusion region formed by implanting first conduction type impurities by using said gate electrode as a mask and said second conduction type source region is a second conduction type impurity diffusion region formed by second conduction type impurities by using the gate electrode as a mask.

5. A semiconductor device according to claim 1, wherein said second conduction type drift region is a second conduction type impurity diffusion region formed by using a difference in the diffusion length between at least two kinds of second conduction type impurities with different diffusion coefficients and at least one kind of first conduction type impurities having a diffusion coefficient approximately equal to or larger than at least one kind of the second conduction type impurities.

6. A semiconductor device comprising:
   a first conduction type semiconductor substrate;
   a gate insulating film disposed on the first conduction type semiconductor substrate;
   a gate electrode provided on the gate insulating film, the gate electrode having a tapered side wall;
   a first conduction type body region formed adjacent to the gate electrode;
   a second conduction type source region and a channel region which are formed within said first conduction type body region;
   a drain region formed apart from said first conduction type body region; and
   a second conduction type drift region formed between the channel region and the drain region, and the drift region having a shallow portion disposed below the gate electrode and a deep portion disposed in the vicinity of the drain region,
   wherein the shallow portion of the drift region is entirely disposed below the gate electrode.

7. A semiconductor device comprising:
   a first conduction type semiconductor substrate;
   a gate insulating film disposed on the first conduction type semiconductor substrate;
   a gate electrode provided on the gate insulating film, the gate electrode having a tapered side wall;
   a first conduction type body region formed adjacent to the gate electrode;
   a second conduction type source region and a channel region which are formed within the first conduction type body region;
   a drain region formed apart from said first conduction type body region; and
   a second conduction type drift region formed between the channel region and the drain region, and the drift region having a shallow portion disposed below the gate electrode and a deep portion disposed in the vicinity of the drain region,
   wherein the gate insulating film has a first insulating portion having a first thickness and a second insulating portion having a second thickness, the first thickness is larger than the second thickness,
   wherein the a shallow portion of the drift region is disposed entirely below the gate electrode.

* * * * *